United States Patent
Lee et al.

(10) Patent No.: US 6,856,071 B2
(45) Date of Patent: Feb. 15, 2005

(54) PIEZOELECTRIC TRANSDUCER MODULE HAVING INTERCONNECTED TRANSDUCER UNITS

(75) Inventors: Chao-Ping Lee, Kaohsiung (TW); Chen-Yi Huang, Kaohsiung (TW)

(73) Assignee: Sunnytec Electronics Co., Ltd., Kaosiung (TW)

( * ) Notice: Subject to any disclaimer, the term of this patent is extended or adjusted under 35 U.S.C. 154(b) by 120 days.

(21) Appl. No.: 10/321,586

(22) Filed: Dec. 18, 2002

(65) Prior Publication Data

US 2004/0119379 A1 Jun. 24, 2004

(51) Int. Cl.$^7$ .............................................. H01L 41/08
(52) U.S. Cl. ...................................... 310/321; 310/370
(58) Field of Search ................................ 310/321, 322, 310/323.01, 328, 330, 331, 370

(56) References Cited

U.S. PATENT DOCUMENTS

| | | | | |
|---|---|---|---|---|
| 4,220,885 A | * | 9/1980 | Yamashita et al. ............ | 310/321 |
| 4,328,442 A | * | 5/1982 | Tanaka et al. ............... | 310/326 |
| 4,876,675 A | * | 10/1989 | Ogura et al. ................ | 367/155 |
| 5,049,776 A | * | 9/1991 | Ogawa ........................ | 310/333 |
| 5,804,906 A | * | 9/1998 | Tsutsumi .................... | 310/322 |
| 5,811,911 A | * | 9/1998 | Janker et al. ............... | 310/332 |

* cited by examiner

Primary Examiner—Mark Budd
(74) Attorney, Agent, or Firm—Baker Botts L.L.P.

(57) ABSTRACT

A piezoelectric transducer module includes first and second transducer units, each of which includes a conductive substrate portion that extends in a first direction and that has first and second surfaces opposite to each other in a second direction transverse to the first direction. At least one of the first and second surfaces has a piezoelectrically active coating coated thereon. The first and second transducer units are spaced apart from each other in the second direction. A connecting unit extends in the second direction and has opposite ends connected to the substrate portions of the first and second transducer units, respectively. The substrate portions of the first and second transducer units and the connecting unit are formed from a unitary conductive plate that is folded at junctions of the connecting unit and the substrate portions of the first and second transducer units.

12 Claims, 7 Drawing Sheets

PIEZOELECTRIC TRANSDUCER MODULE HAVING INTERCONNECTED TRANSDUCER UNITS

BACKGROUND OF THE INVENTION

1. Field of the Invention

The invention relates to a piezoelectric transducer, more particularly to a piezoelectric transducer module having interconnected transducer units.

2. Description of the Related Art

A transducer is a device that converts energy from one form to another. Transducers are commonly used for transformation of electrical energy into mechanical energy, and are extensively applied in the fields of electronics, electrical, mechanical and physics. Transducers for acoustic applications are commonly found in buzzers, earphones, microphones, speakers, etc.

Presently, piezoelectric material is commonly used as a basic component of transducers. When the piezoelectric material is subjected to a voltage drop, it mechanically deforms. Examples of materials that exhibit piezoelectric behavior include quartz, Rochelle salt, lead titanate zirconate cermics, barium titanate, and polyvinylidene fluoride.

Figure 1:
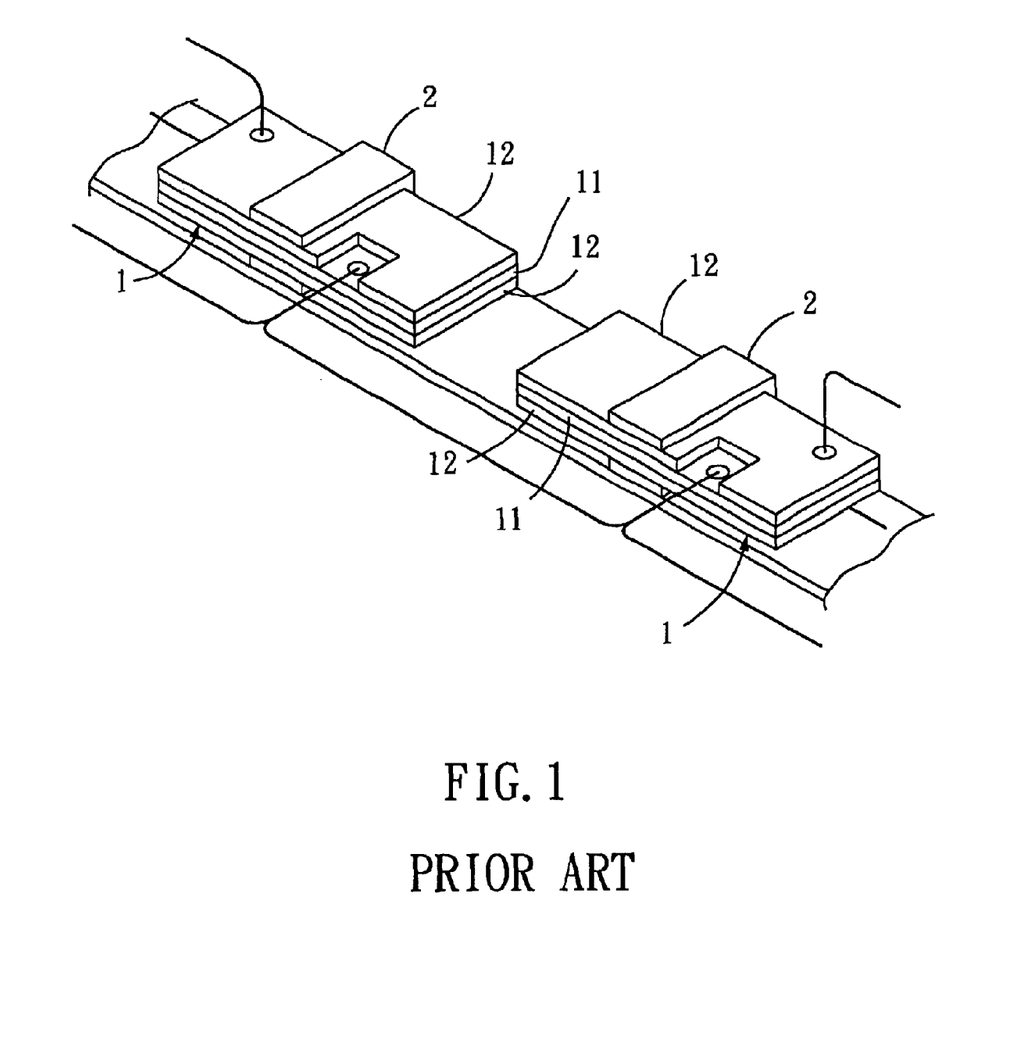
FIG. 1 is a perspective view of a conventional electroacoustic transducer.

FIG. 1 illustrates conventional electroacoustic transducer units 1 mounted on support members 2, respectively. Each of the transducer units 1 includes a metal substrate portion 11 coated with a piezoelectrically active coating 12 on opposite surfaces thereof. A set of contact wires is bonded to the piezoelectrically active coatings 12 and is adapted to be connected to an electrical signal source (not shown). Similarly, a contact wire is bonded to the substrate portion 11 and is adapted to be connected to the electrical signal source. In order to avoid undesired electrical contact between the contact wire of the substrate portion 11 and those of the piezoelectrically active coatings 12, a part of the piezoelectrically active coatings 12 on the substrate portion 11 is etched for bonding of the contact wire on the substrate portion 11. However, since each of the transducer units 1 is only 0.45 mm thick, a high level of accuracy is required during the contact wire bonding. This results in inefficient use of time, effort and material.

In U.S. Pat. No. 6,323,583, there is disclosed a piezoelectric bending transducer that includes a flat, electrically conductive supporting body having piezoelectrically active coatings on both sides. The piezoelectrically active coatings are omitted from one end of the supporting body, which is fixed in a connector base. Each of the coatings and the supporting body are electrically connected to a plug-in contact that includes an electrically conductive elastomer in a cavity in the connector base for accepting a contact pin that deforms the elastomer when the contact pin is inserted thereinto. The contact pins are adapted to be connected to an electrical signal source. This arrangement is particularly adapted for incorporation into a transducer module with transducers secured adjacent to each other in a common connector base.

Although the transducer in the aforesaid patent dispenses with the bonding of contact wires as required in the prior art of FIG. 1, etching of a part of the piezoelectrically active coatings is still needed, which results in manufacturing inefficiency and material waste. Further, since the transducer includes numerous small components, such as the connector base, plug-in contacts, etc., the difficulty in manufacturing the transducer is aggravated.

SUMMARY OF THE INVENTION

Therefore, the object of the present invention is to provide a piezoelectric transducer module that is relatively easy to manufacture and assemble, that can be produced with minimal material waste, and that includes a plurality of interconnected transducer units.

According to the present invention, a piezoelectric transducer module comprises:

first and second transducer units, each of which includes a conductive substrate portion that extends in a first direction and that has first and second surfaces opposite to each other in a second direction transverse to the first direction, at least one of the first and second surfaces having a piezoelectrically active coating coated thereon, the first and second transducer units being spaced apart from each other in the second direction; and a connecting unit extending in the second direction and having opposite ends connected to the substrate portions of the first and second transducer units, respectively.

The substrate portions of the first and second transducer units and the connecting unit are formed from a unitary conductive plate that is folded at junctions of the connecting unit and the substrate portions of the first and second transducer units.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 2:
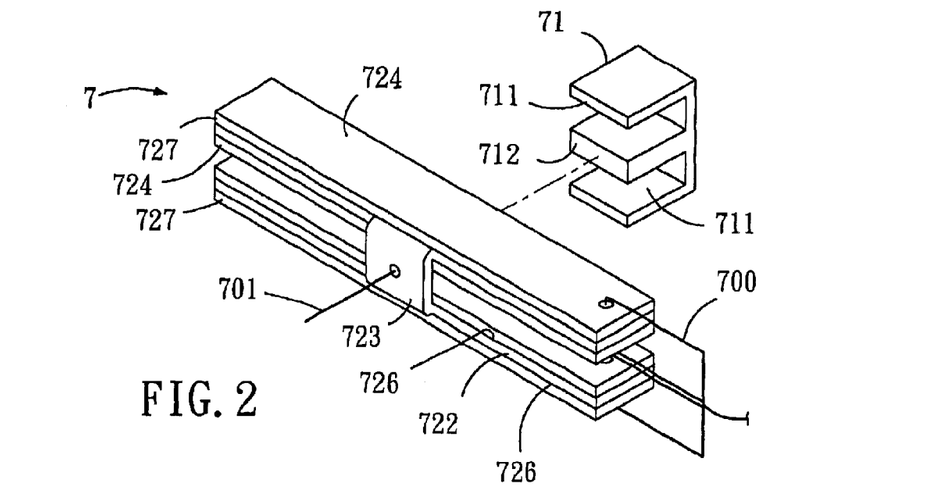
FIG. 2 is an exploded perspective view of the first preferred embodiment of a piezoelectric transducer module according to the present invention.
Figure 3:
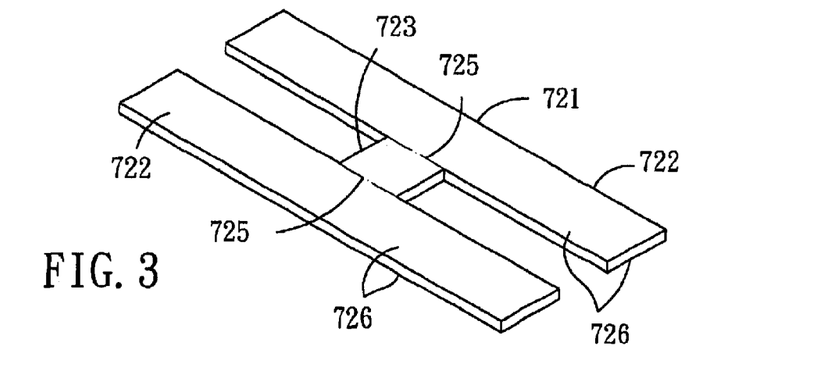
FIG. 3 is a perspective view of a conductive body used in the first preferred embodiment.

Referring to FIGS. 2 and 3, the first preferred embodiment of a piezoelectric transducer module 7 according to the present invention is shown to include first and second transducer units 727, and a connecting unit 723. Each of the first and second transducer units 727 includes a conductive substrate portion 722 that extends in a first direction and that has first and second surfaces 726 opposite to each other in a second direction transverse to the first direction. In this embodiment, each of the first and second surfaces 726 of the substrate portion 722 of each of the first and second transducer units 727 is coated with a piezoelectrically active coating 724. The first and second transducer units 727 are spaced apart from each other in the second direction.

The connecting unit 723 extends in the second direction and has opposite ends 725 connected to the substrate portions 722 of the first and second transducer units 727, respectively. The connecting unit 723 is free of the piezoelectrically active coating 724.

The substrate portions 722 of the first and second transducer units 727, and the connecting unit 723 are formed from a unitary conductive plate 721. The conductive plate 721 is folded at the junctions of the connecting unit 723 and the substrate portions 722 of the first and second transducer units 727 to form a generally c-shaped structure.

The piezoelectric transducer module 7 further includes a set of contact wires 700, each of which is bonded to a respective one of the piezoelectrically active coatings 724 on the substrate portions 722 of the first and second transducer units 727, and each of which is adapted to be connected electrically to an electrical signal source (not shown). A contact wire 701 is also bonded to the connecting unit 723 and is adapted to be connected electrically to the electrical signal source.

Figure 4:
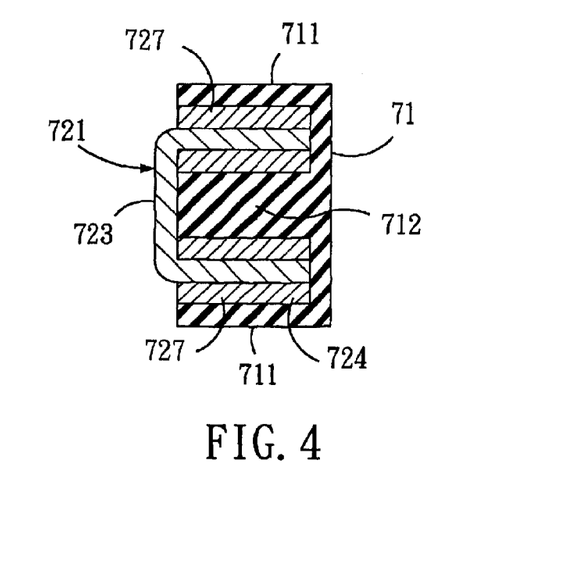
FIG. 4 is a sectional view of the first preferred embodiment.

With further reference to FIG. 4, the piezoelectric transducer module 7 further includes an insulating support member 71 that has a spacer portion 712 disposed between the first and second transducer units 727, and a pair of securing portions 711, each of which secures a respective one of the first and second transducer units 727 on the spacer portion 712.

In the first preferred embodiment, a pair of transducer units 727 can be constructed at one time by pressing or stamping a metal sheet to form the conductive plate 721 having the desired shape, followed by coating the substrate portions 722 with the piezoelectrically active coatings 724. Moreover, since the connecting unit 723 and the substrate portion 722 are formed from a unitary conductive plate 721, a single contact wire 701 can be bonded on the connecting unit 723 without the need for etching the piezoelectrically active coatings 724 on the substrate portions 722.

Figure 5:
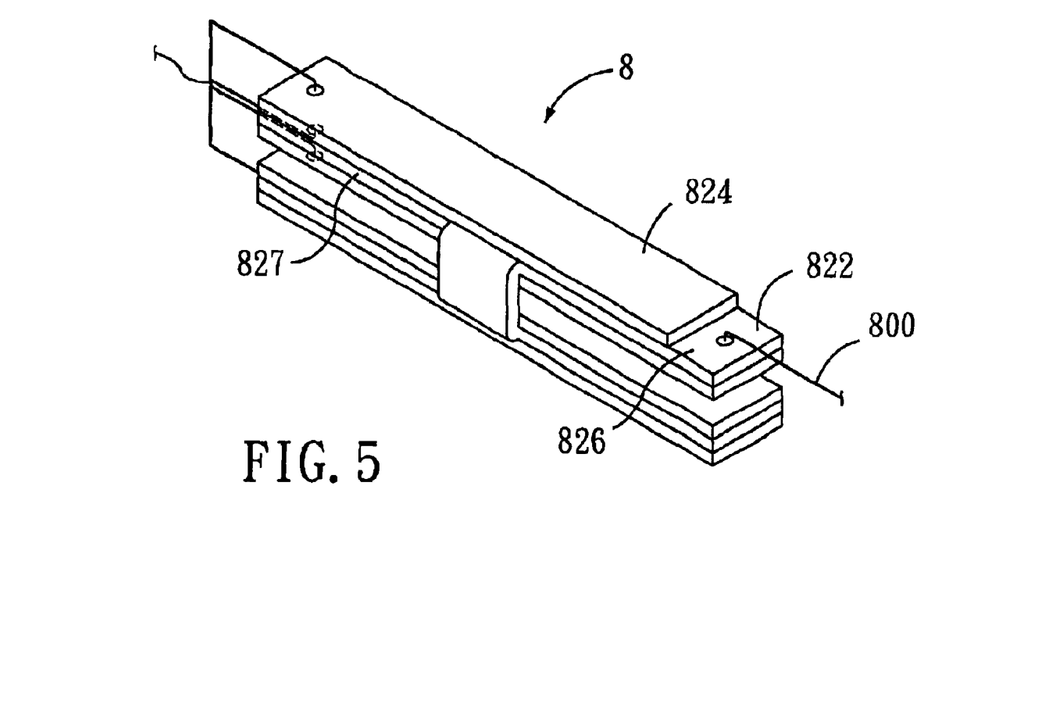
FIG. 5 is a perspective view of the second preferred embodiment of a piezoelectric transducer module according to the present invention.

FIG. 5 illustrates the second preferred embodiment of a piezoelectric transducer module 8 according to the present invention. When compared with the first preferred embodiment, the first surface 826 of the substrate portion 822 of the first transducer unit 827 has a wire-bonding segment free of the piezoelectrically active coating 824. The contact wire 800 is bonded to the wire-bonding segment and is adapted to be connected electrically to the electrical signal source.

Figure 6:
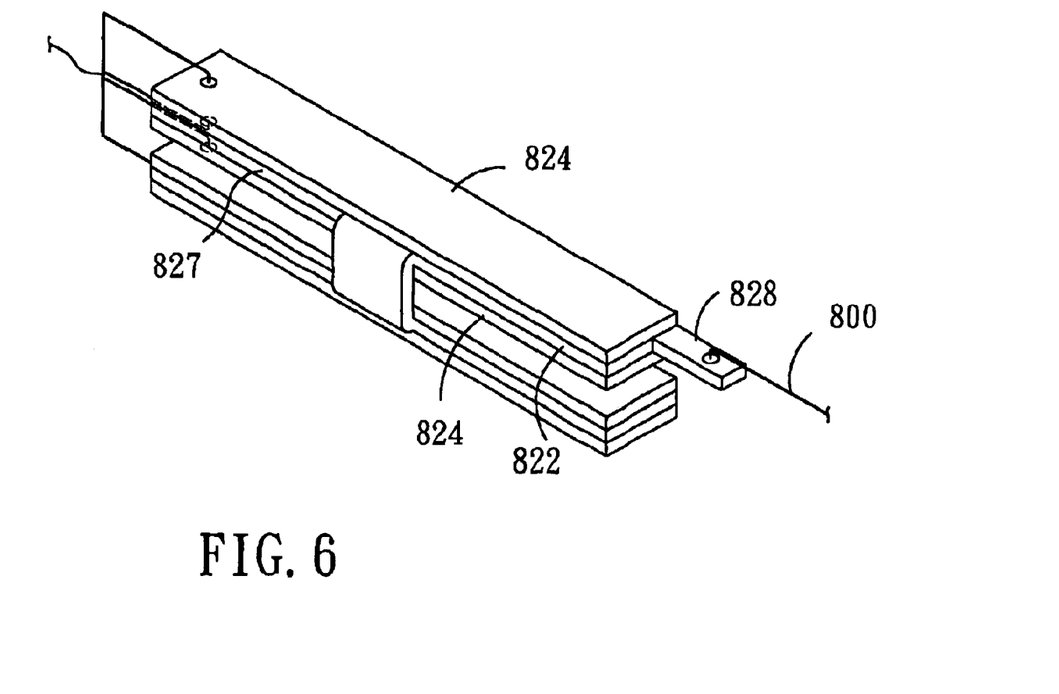
FIG. 6 is a perspective view of the third preferred embodiment of a piezoelectric transducer module according to the present invention.

FIG. 6 illustrates the third preferred embodiment of a piezoelectric transducer module according to the present invention. When compared with the first preferred embodiment, the substrate portion 822 of the first transducer unit 827 further has an extended segment 828 free of the piezoelectrically active coating 824. The contact wire 800 is bonded to the extended segment 828 and is adapted to be connected electrically to the electrical signal source.

Figure 7:
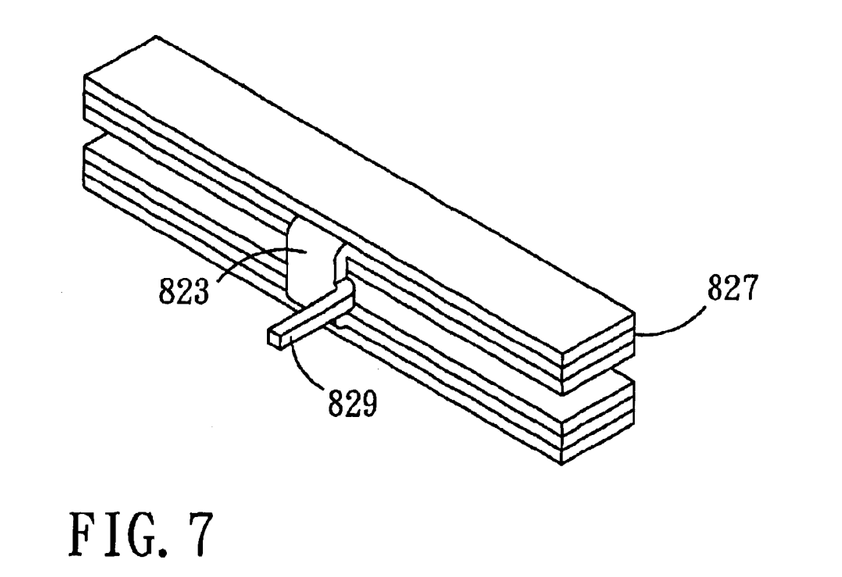
FIGS. 7 and 8 are perspective views of the fourth preferred embodiment of a piezoelectric transducer module according to the present invention.
Figure 8:
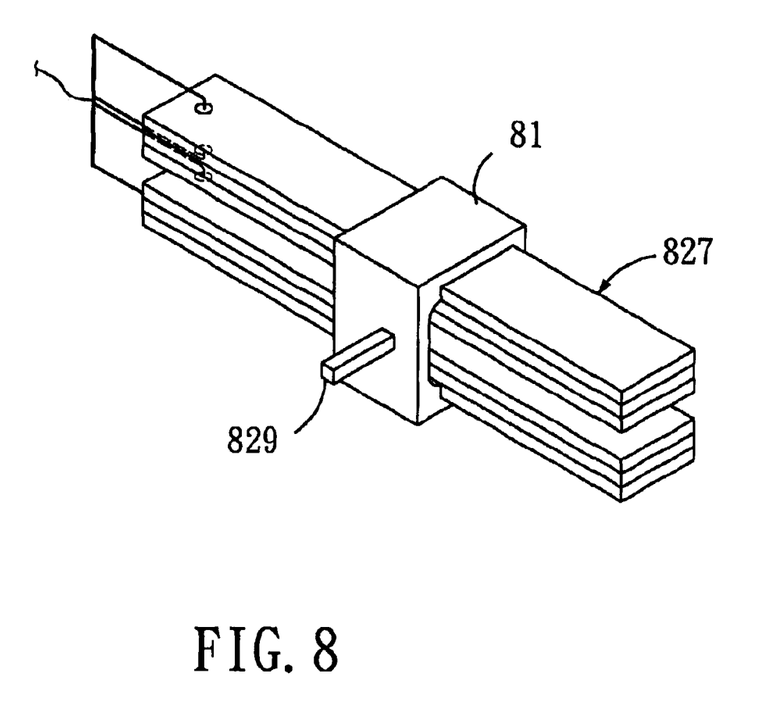

FIGS. 7 and 8 illustrate the fourth preferred embodiment of a piezoelectric transducer module according to the present invention. When compared with the first preferred embodiment, the connecting unit 823 is formed with a contact segment 829 that extends in the first direction and that is adapted to be connected electrically to the electrical signal source.

The piezoelectric transducer module of this embodiment further includes an insulating support member 81. The support member 81 is formed by injection molding directly on the transducer units 827 and the connecting unit 823, with the contact segment 829 extending outwardly of the support member 81.

Figure 9:
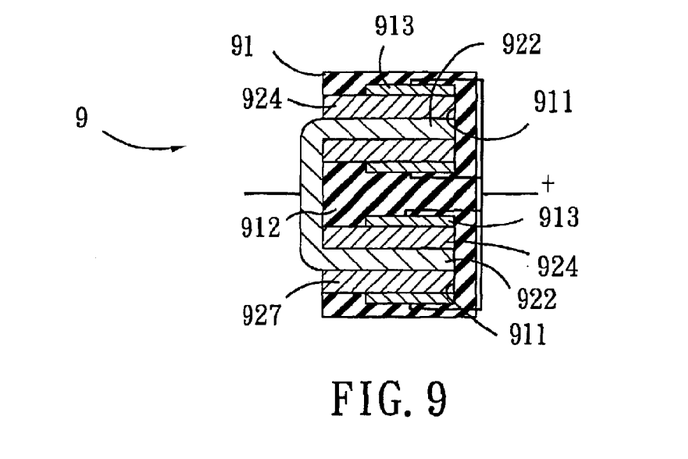
FIG. 9 is a sectional view of the fifth preferred embodiment of a piezoelectric transducer module according to the present invention.

FIG. 9 illustrates the fifth preferred embodiment of a piezoelectric transducer module 9 according to the present invention. When compared with the first preferred embodiment, the support member 91 is provided with a set of contact plates 913 on the spacer portion 912 and the securing portions 911. The contact plates 913 establish electrical contact with the piezoelectrically active coatings 924 on the substrate portions 922 of the first and second transducer units 927, respectively, and are adapted to be connected electrically to the electrical signal source. As such, there is no need to bond contact wires on the piezoelectrically active coatings 924.

Figure 10:
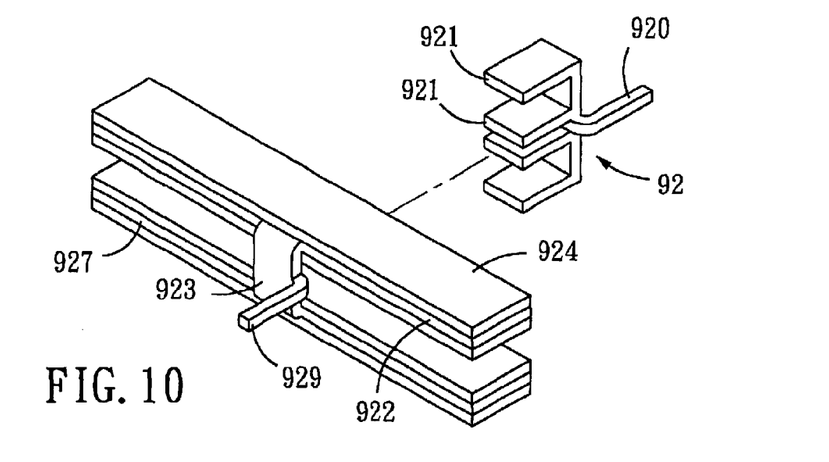
FIG. 10 is an exploded perspective view of the sixth preferred embodiment of a piezoelectric transducer module according to the present invention.
Figure 11:
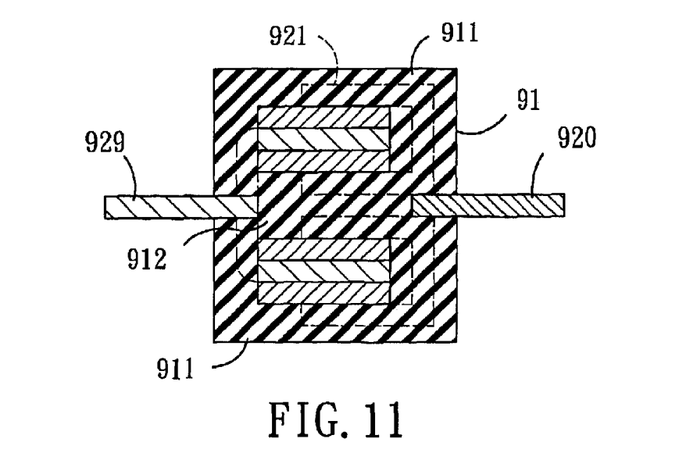
FIG. 11 is a sectional view of the sixth preferred embodiment.

FIGS. 10 and 11 illustrate the sixth preferred embodiment of a piezoelectric transducer module according to the present invention. When compared with the first preferred embodiment, the connecting unit 923 is formed with a contact segment 929 that extends in the first direction and that is adapted to be connected electrically to the electrical signal source. The transducer module further includes a conductive contact member 92 that has a set of contact portions 921 for establishing electrical contact with the piezoelectrically active coatings 924 on the substrate portions 922 of the first and second transducer units 927, respectively. The contact member 92 is formed with a contact segment 920 that extends in the first direction and that is adapted to be connected electrically to the electrical signal source.

The piezoelectric transducer module further includes an insulating support member 91 that encloses the connecting unit 923 and the contact member 92 and that has a spacer portion 912 disposed between the first and second transducer units 927, and a pair of securing portions 911, each of which secures a respective one of the first and second transducer units 927 on the spacer portion 912. Preferably, the support member 91 is formed by injection molding.

Figure 12:
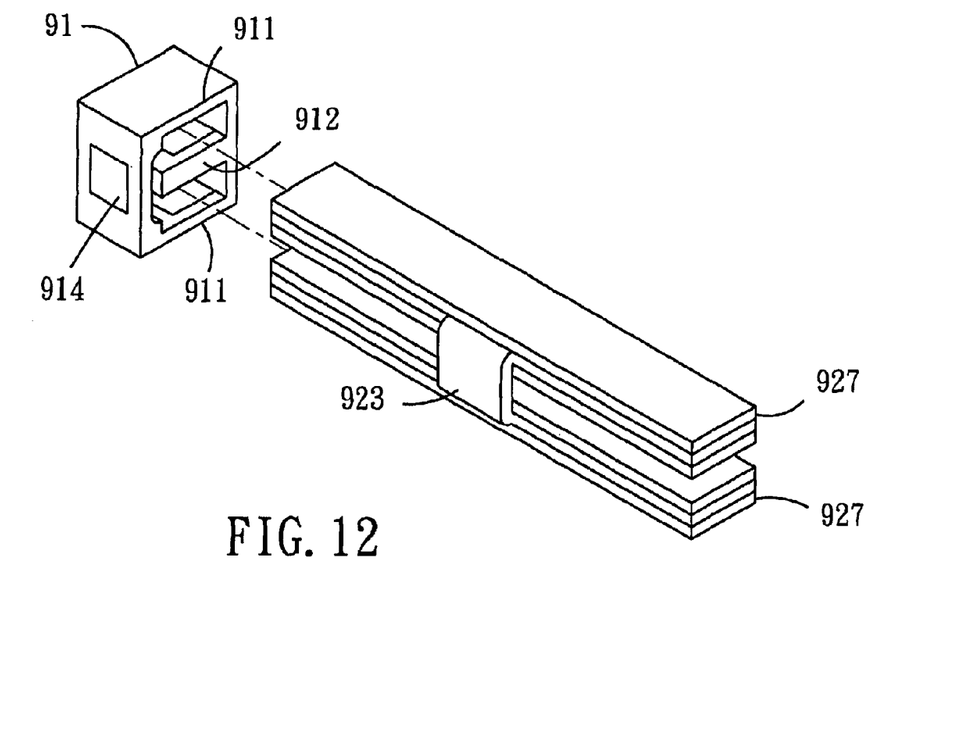
FIG. 12 is an exploded perspective view of the seventh preferred embodiment of a piezoelectric transducer module according to the present invention.
Figure 13:
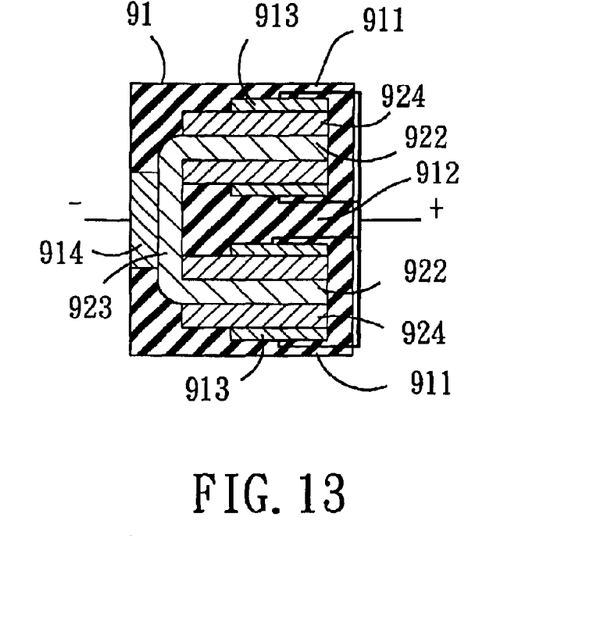
FIG. 13 is a sectional view of the seventh preferred embodiment.

FIGS. 12 and 13 illustrate the seventh preferred embodiment of a piezoelectric transducer module according to the present invention. When compared to the first preferred embodiment, the insulating support member 91 encloses the connecting unit 923 and has a spacer portion 912 disposed between the first and second transducer units 927, and a pair of securing portions 911, each of which secures a respective one of the first and second transducer units 927 on the spacer portion 912.

The support member 91 is provided with a set of contact plates 913 on the spacer portion 912 and the securing portions 911. The contact plates 913 establish electrical contact with the piezoelectrically active coatings 924 on the substrate portions 922 of the first and second transducer units 927, respectively, and are adapted to be connected electrically to the electrical signal source. The support member 91 is further provided with a contact plate 914 for establishing electrical contact with the connecting unit 923. The contact plate 914 is adapted to be connected electrically to the electrical signal source.

Figure 14:
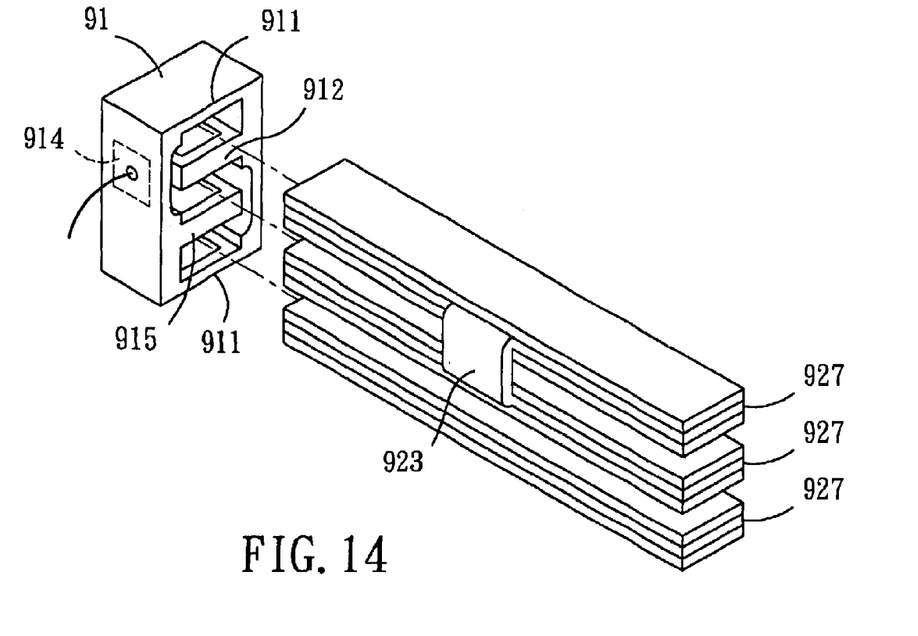
FIG. 14 is an exploded perspective view of the eighth preferred embodiment of a piezoelectric transducer module according to the present invention.
Figure 15:
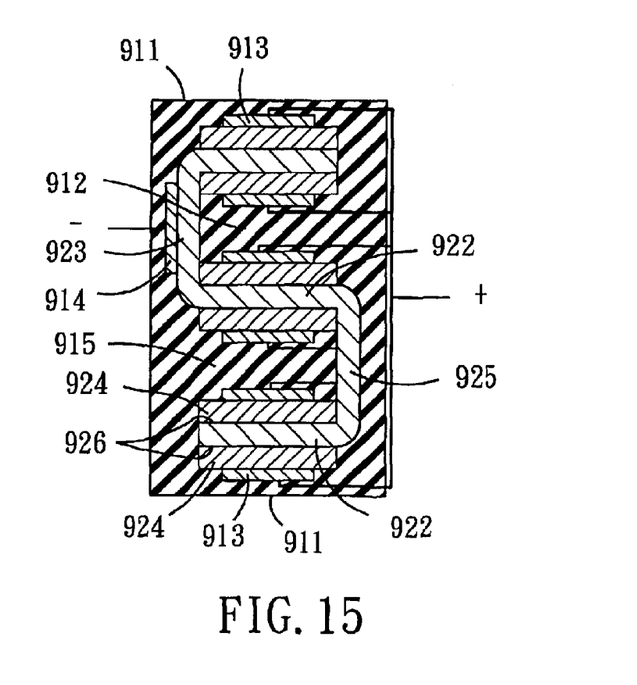
FIG. 15 is a sectional view of the eighth preferred embodiment.

FIGS. 14 and 15 illustrate the eighth preferred embodiment of a piezoelectric transducer module according to the present invention. When compared with the first preferred embodiment, the transducer module further includes a third transducer unit 927 and a second connecting unit 925. The third transducer unit 927 is spaced apart from the second transducer unit 827 in the second direction. The third transducer unit 927 includes a conductive substrate portion 922 that extends in the first direction and that has first and second surfaces 926 opposite to each other in the second direction. The first and second surfaces 926 of the substrate portion 922 of the third transducer unit 927 are each coated with the piezoelectrically active coating 924.

The second connecting unit 925 extends in the second direction and has opposite ends connected to the substrate portions 922 of the second and third transducer units 927, respectively. The second connecting unit 925 is spaced apart from the first connecting unit 923 in the first direction.

The piezoelectric transducer module further includes an insulating support member 91 that has a first spacer portion 912 disposed between the first and second transducer units 927, a second spacer portion 915 disposed between the second and third transducer units 927, and a pair of securing portions 911, each of which secures a respective one of the first and third transducer units 927 on an adjacent one of the first and second spacer portions 912, 915.

The support member 91 is provided with additional contact plates 913 on the spacer portions 912, 915 and the securing portions 911. The contact plates 913 establish electrical contact with the piezoelectrically active coatings 924 on the substrate portions 922 of the first, second and third transducer units 927, respectively, and are adapted to be connected electrically to the electrical signal source. The support member 91 is further provided with a contact plate 914 for establishing electrical contact with the first connecting unit 923. The contact plate 914 is also adapted to be connected electrically to the electrical signal source.

In this embodiment, the complementing structures of the transducer units 927 and the support member 91 firmly secure the transducer units 927 in the support member 91. Moreover, since the connecting units 923, 925 are enclosed within the securing portions 911 of the support member 91, a contact wire cannot be bonded directly on the connecting units 923, 925. However, through the contact plate 914, the substrate portions 922 of the transducer units 927 can still be connected electrically to the electrical signal source.

From the above description, the piezoelectric transducer module 7, 8, 9 of this invention is formed from a unitary conductive plate 721 that is folded to produce transducer units 727, 827, 927. Each of the surfaces 726, 826, 926 of the substrate portion 722, 822, 922 of each of the transducer units 726, 826, 926 is then coated with the piezoelectrically active coatings 724, 824, 924. The arrangement as such simplifies the manufacturing procedure. Furthermore, the piezoelectrically active coatings 724, 824, 924 need not be etched to bond contact wires. This results in increased manufacturing efficiency and minimal material waste.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction;

a connecting unit extending in the second direction and having opposite ends connected to said substrate portions of said first and second transducer units, respectively; and an insulating support member having a spacer portion disposed between said first and second transducer units, and a pair of securing portions, each of which secures a respective one of said first and second transducer units on said spacer portion;

wherein said substrate portions of said first and second transducer units and said connecting unit are formed from a unitary conductive plate that is folded at junctions of said connecting unit and said substrate portions of said first and second transducer units.

2. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction; and a connecting unit extending in the second direction and having opposite ends connected to said substrate portions of said first and second transducer units, respectively;

wherein said substrate portions of said first and second transducer units and said connecting unit are formed from a unitary conductive plate that is folded at junctions of said connecting unit and said substrate portions of said first and second transducer units; and wherein one of said first and second surfaces of said substrate portion of said first transducer unit has a wire-bonding segment free of said piezoelectrically active coating, said piezoelectric transducer module further comprising a contact wire bonded to said wire-bonding segment and adapted to be connected electrically to an electrical signal source.

3. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction; and a connecting unit extending in the second direction and having opposite ends connected to said substrate portions of said first and second transducer units, respectively;

wherein said substrate portions of said first and second transducer units and said connecting unit are formed from a unitary conductive plate that is folded at junctions of said connecting unit and said substrate portions of said first and second transducer units; an wherein said substrate portion of said first transducer unit further has an extended segment free of said piezoelectrically active coating, said piezoelectric transducer module further comprising a contact wire bonded to said extended segment and adapted to be connected electrically to an electrical signal source.

4. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction; and a connecting unit extending in the second direction and having opposite ends connected to said substrate portions of said first and second transducer units, respectively;

wherein said substrate portions of said first and second transducer units and said connecting unit are formed from a unitary conductive plate that is folded at junctions of said connecting unit and said substrate portions of said first and second transducer units; and wherein said connecting unit is formed with a contact segment that extends in the first direction and that is adapted to be connected electrically to an electrical signal source.

5. The piezoelectric transducer module of claim 4, further comprising an insulating support member having a spacer portion disposed between said first and second transducer units, and a pair of securing portions, each of which secures a respective one of said first and second transducer units on said spacer portion, said contact segment extending outwardly of said support member.

6. The piezoelectric transducer module of claim 1, wherein said support member is provided with a set of contact plates on at least one of said spacer portion and said securing portions, said contact plates establishing electrical contact with said piezoelectrically active coatings on said substrate portions of said first and second transducer units, respectively, and being adapted to be connected electrically to an electrical signal source.

7. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction;

a connecting unit extending in the second direction and having opposite ends connected to said substrate portions of said first and second transducer units, respectively; and a conductive contact member having a set of contact portions for establishing electrical contact with said piezoelectrically active coatings on said substrate portions of said first and second transducer units, respectively, said contact member being adapted to be connected electrically to an electrical signal source;

wherein said substrate portions of said first and second transducer units and said connecting unit are formed from a unitary conductive plate that is folded at junctions of said connecting unit and said substrate portions of said first and second transducer units; and wherein each of said first connecting unit and said contact member is formed with a contact segment that extends in the first direction and that is adapted to be connected electrically to the electrical signal source.

8. A piezoelectric transducer module comprising:

first and second transducer units, each of which includes a conductive substrate portion that extends in a first direction and that has first and second surfaces opposite to each other in a second direction transverse to the first direction, at least one of said first and second surfaces having a piezoelectrically active coating coated thereon, said first and second transducer units being spaced apart from each other in the second direction;

a connecting unit extending in the second direction and having opposite ends connected to said substrate portions of said first and second transducer units, respectively:

a conductive contact member having a set of contact portions for establishing electrical contact with said piezoelectrically active coatings on said substrate portions of said first and second transducer units, respectively, said contact member being adapted to be connected electrically to an electrical signal source; and an insulating support member that encloses said first connecting unit and said contact member and that has a spacer portion disposed between said first and second transducer units, and a pair of securing portions, each of which secures a respective one of said first and second transducer units on said spacer portion;

wherein said substrate portions of said first and second transducer units and said connecting unit are formed from a unitary conductive plate that is folded at junctions of said connecting unit and said substrate portions of said first and second transducer units.

9. The piezoelectric transducer module of claim 8, wherein each of said first connecting unit and said contact member is formed with a contact segment that extends in the first direction through said support member and that is adapted to be connected electrically to the electrical signal source.

10. The piezoelectric transducer module of claim 1, wherein said support member is provided with a contact plate for establishing electrical contact with said connecting unit, said contact plate being adapted to be connected electrically to an electrical signal source.

11. A piezoelectric transducer module comprising:

first, second, and third transducer units, each of which includes a conductive substrate portion that extends in a first direction and that has first and second surfaces opposite to each other in a second direction transverse to the first direction, at least one of said first and second surfaces having a piezoelectrically active coating coated thereon, said first, second, and third transducer units being spaced apart from each other in the second direction;

a first connecting unit extending in the second direction and having opposite ends connected to said substrate portions of said first and second transducer units, respectively; and a second connecting unit extending in the second direction and having opposite ends connected to said substrate portions of said second and third transducer units, respectively, said second connecting unit being spaced apart from said first connecting unit in the first direction;

wherein said substrate portions of said first and second transducer units and said connecting unit are formed from a unitary conductive plate that is folded at junctions of said connecting unit and said substrate portions of said first and second transducer units.

12. The piezoelectric transducer module of claim 11, further comprising an insulating support member having a first spacer portion disposed between said first and second transducer units, a second spacer portion disposed between said second and third transducer unit, and a pair of securing portions, each of which secures a respective one of said first and third transducer units on an adjacent one of said first and second spacer portions.

* * * * *